United States Patent
Lin et al.

(10) Patent No.: US 7,821,861 B2
(45) Date of Patent: Oct. 26, 2010

(54) MEMORY DEVICE AND REFRESH METHOD THEREOF

(75) Inventors: Chien-Hong Lin, Hsinchu County (TW); Tzu-Fang Lee, Hsinchu (TW); Chi-Lung Wang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 275 days.

(21) Appl. No.: 12/127,020

(22) Filed: May 27, 2008

(65) Prior Publication Data
US 2009/0161467 A1 Jun. 25, 2009

(30) Foreign Application Priority Data
Dec. 25, 2007 (TW) .............................. 96149941 A

(51) Int. Cl.
G11C 7/00 (2006.01)
G11C 8/00 (2006.01)

(52) U.S. Cl. .............. 365/222; 365/189.12; 365/230.03; 365/236; 365/240

(58) Field of Classification Search ................. 365/222, 365/189.12, 230.03, 230, 240, 236
See application file for complete search history.

(56) References Cited

U.S. PATENT DOCUMENTS

| | | | |
|---|---|---|---|
| 5,987,589 A * | 11/1999 | Kawasaki et al. ........... 365/222 |
| 6,094,705 A | 7/2000 | Song |
| 6,154,409 A | 11/2000 | Huang et al. |
| 6,167,484 A | 12/2000 | Boyer et al. |
| 6,178,479 B1 | 1/2001 | Vishin |
| 6,240,032 B1 * | 5/2001 | Fukumoto ................... 365/222 |
| 6,426,909 B1 * | 7/2002 | Tomita ....................... 365/222 |
| 6,490,216 B1 | 12/2002 | Chen et al. |
| 6,515,929 B1 | 2/2003 | Ting et al. |
| 6,542,957 B2 * | 4/2003 | Miura et al. ................. 365/222 |
| 6,650,586 B1 * | 11/2003 | Fanning ...................... 365/222 |
| 6,999,369 B2 | 2/2006 | Perner |
| 7,000,846 B2 * | 2/2006 | Hakushi et al. ............. 365/222 |
| 7,020,038 B2 | 3/2006 | Shieh |
| 7,031,217 B2 * | 4/2006 | Hiraki et al. ................ 365/222 |
| 7,366,034 B2 * | 4/2008 | Kozakai et al. ............. 365/222 |
| 7,427,031 B2 * | 9/2008 | Hakushi et al. ............. 365/222 |

* cited by examiner

Primary Examiner—Trong Phan
(74) Attorney, Agent, or Firm—Jianq Chyun IP Office

(57) ABSTRACT

A memory device and a refresh method are provided herein. The memory device includes a memory array having memory rows. When an array refresh strobe (ARS) signal is received, it is determined whether the memory rows are required to be refreshed according to tag flags and reset statuses corresponding to the memory rows. When a row refresh strobe (RRS) signal is received, it is determined whether to refresh one of the memory rows according to a plurality of parameters including a value of a row to refresh counter, a value of a refresh deadline counter and/or a queue. When it is decided to start a refresh operation, one of the memory rows is selected according to the tag flag and the status, and the status of the selected memory row is updated after the selected memory row is refreshed.

26 Claims, 13 Drawing Sheets

Note: x means "Don't Care"

| Input | Output |
|---|---|
| 1xxx xxxx xxxx xxxx | 1000 0000 0000 0000 |
| 01xx xxxx xxxx xxxx | 0100 0000 0000 0000 |
| 001x xxxx xxxx xxxx | 0010 0000 0000 0000 |
| 0001 xxxx xxxx xxxx | 0001 0000 0000 0000 |
| 0000 1xxx xxxx xxxx | 0000 1000 0000 0000 |
| 0000 01xx xxxx xxxx | 0000 0100 0000 0000 |
| 0000 001x xxxx xxxx | 0000 0010 0000 0000 |
| 0000 0001 xxxx xxxx | 0000 0001 0000 0000 |
| 0000 0000 1xxx xxxx | 0000 0000 1000 0000 |
| 0000 0000 01xx xxxx | 0000 0000 0100 0000 |
| 0000 0000 001x xxxx | 0000 0000 0010 0000 |
| 0000 0000 0001 xxxx | 0000 0000 0001 0000 |
| 0000 0000 0000 1xxx | 0000 0000 0000 1000 |
| 0000 0000 0000 01xx | 0000 0000 0000 0100 |
| 0000 0000 0000 001x | 0000 0000 0000 0010 |
| 0000 0000 0000 0001 | 0000 0000 0000 0001 |

FIG. 12

MEMORY DEVICE AND REFRESH METHOD THEREOF

CROSS-REFERENCE TO RELATED APPLICATION

This application claims the priority benefit of Taiwan application serial no. 96149941, filed on Dec. 25, 2007. The entirety of the above-mentioned patent application is hereby incorporated by reference herein and made a part of this specification.

BACKGROUND OF THE INVENTION

1. Field of the Invention

The present invention relates to a refresh method of a memory array and a refresh circuit.

2. Description of Related Art

Along with the development of the fabricating process, embedded memories occupies an increasing portion in a highly integrated a system on a chip (SOC). According to researches, it is forecasted that the embedded-memories will occupy 60% of the SOC. Therefore, it is an important topic to improve the efficiency of the memory and reduce the power consumption when raising an integration of the embedded memory.

FIG. 1 is a structure diagram illustrating a dynamic random access memory (DRAM) 100. Referring to FIG. 1, a basic structure of the DRAM 100 includes a memory array 110, a multiplexer 120, a row address decoder 130, a column selector 140, a binary counter 150, a sense amplifier 160, and a pre-charge circuit 170. The memory array 110 mainly includes a plurality of word lines 112 and a plurality of bit lines 114. The word lines 112 and the bit lines 114 cross each other. Each of intersections has a memory cell 116. The memory array 110 is constituted by a plurality of memory cells 116. Each of the memory cells is constituted by a transistor and a storage capacitor.

When the DRAM 100 receives an access row address (ARA), a row address decoder 130 decodes the ARA first. Then, the word line 112 corresponding to the ARA is enabled by the multiplexer 120 in order to activate all of the transistors on the word line 112. After a pre-charge voltage $V_{precharge}$ is applied to the pre-charge circuit 170, electric charges stored in the capacitor flow to the bit lines 114 in a longitudinal direction. Then, data is amplified by means of the sense amplifier 160 according to a reference voltage $V_{REF}$. A column address (CA) is transmitted to a column decoder 142, and thereby the data corresponding to the CA is read or written. After performing a reading operation or a writing operation, the data returns to the memory cell 116 through a feedback circuit.

It should be noted that even the transistor in the memory cell 116 is in a close status, the electric charges stored in the capacitor are decreased as the time goes by, so that the data disappear. Therefore, it is required to provide a mechanism for refreshing the data periodically in a memory. Generally, the data is refreshed in every time interval. For example, when the electric charges are decreased to a minimum detectable electric charge, a system provides a refresh address (REFA) by using a binary counter 150, and the system controls the multiplexer 120 to select and output the REFA.

After the REFA is decoded by the row address decoder 130, the word line corresponding to the REFA is enabled to activate the transistors of all of the memory cells 116 on the corresponding word line 112, so that the electric charges in the capacitor flow to the longitudinal bit line 114. Afterwards, upon amplifying the data by the sense amplifier 160, the data of the address in the memory is refreshed before the data of the address disappear. When a refresh operation of the memory is performed, the access operation on the memory has to be stopped. Hence, the work efficiency of the memory is affected.

Presently, various methods for improving the work efficiency of the memory are provided. For example, the size of the capacitor is increased, or a current leakage problem is improved, thereby prolonging the time taken by the electric charges in the capacitor to be decreased to the minimum detectable electric charge. However, under the circumstance that the fabricating process is not changed, the work efficiency of the memory usually is increased by reducing the refresh times of the memory. As shown in FIG. 1 as an example, after the system performs the read operation or a write operation, all of the data go back to a memory unit 101. Thereby, the memory unit 101 does not need to be refreshed.

As disclosed in the U.S. Pat. No. 6,154,409, a self row-identified hidden refresh circuit for refreshing a pseudo static random access memory (SRAM) is provided. As shown in FIG. 2, the memory structure of the patent includes a controller 201, a refresh counter 202, a latchable burst array 203, a row decoder 204, a multiplexer 205, a memory array 206, and a column decoder 207. A row address (RA) is provided to the row decoder 204, and a column address (CA) is provided to the column decoder 207. According to the patent, if the memory needs to be accessed at the same time when the controller 201 is performing the refresh operation, it is determined whether the remained time is sufficient to halt the refresh operation.

If the remained time is sufficient, the latchable burst array 203 is used to record the memory row pending to be refreshed, and the access operation is performed first. After the access operation from the outside is completed, or the remained time of the refresh period is only enough to refresh the memory rows not refreshed, the controller 201 completes the refresh operation on the memory rows not refreshed. The refresh operation starts from the memory rows of which the refresh operation is halted.

In U.S. Pat. No. 6,094,705, a method and a system for selective refresh for a memory array are disclosed. As shown in FIG. 3, the structure of the memory device includes a memory array 301, a sense amplifier 302, a column decoder 303, a row decoder 304, a multiplexer 305, a memory access controller 306, and a refresh controller 307.

The patent mainly utilizes a bit register 308 to record the status of a valid bit corresponding to each of the memory rows. When the memory access controller 306 sends a refresh instruction, a binary counter 309 of the refresh controller 307 generates REFAs one by one, and the refresh controller 307 compares the valid bit with the corresponding REFA. If the memory row corresponding to the REFA is invalid or has been written, the refresh operation does not need to be performed.

SUMMARY OF THE INVENTION

A refresh method of a memory array, and a circuit of the memory array are provided according to an example of the present invention. The method records a tag flag value and a status, so as to search out a memory row required to be refreshed prior to other memory rows in a timely manner according to the tag flag value and the status when the memory row requires to be refreshed. When the remained time is sufficient to refresh the memory rows not refreshed, the system is given priority to access the memory rows, so that refresh times and power consumption of a memory can be reduced, and the work efficiency of the memory can be improved. The refresh circuit is embodied according to the above-mentioned method and has the above-mentioned advantages.

According to an exemplary embodiment consistent with the present invention, an optional circuit is utilized to record tags and statuses corresponding to the memory rows, so as to identify whether the memory rows are being used by a system and whether the memory rows are refreshed or accessed. When a row refresh strobe (RRS) signal is received, it is determined whether to refresh the memory row used by the system according to a preset value.

If the time is sufficient to temporarily halt the refresh operation on the system, the system performs the access operations depending on the demands of the system. Therefore, the work efficiency of the memory is increased and the refresh times of the memory are reduced. When it is decided to refresh the memory rows used by the system, a memory row prioritized to be refreshed is searched out timely according to the tags and the statuses in order to speed up a refresh operation of the memory.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 12 illustrates a truth table stored in a priority decoder according to an exemplary embodiment consistent of the present invention.

DESCRIPTION OF EMBODIMENTS

A memory is an essential element in a circuit layout of a system on a chip (SOC). Compared with a static random access memory (SRAM) having 6 transistors, not only the cost of fabricating a dynamic random access memory (DRAM) is lower than that of fabricating the SRAM, but also the integration of the DRAM is higher than that of the SRAM. Because data stored in the DRAM requires being refreshed periodically, the work efficiency of the memory is reduced and the power consumption of the memory is increased when the memory is in a process of being refreshed.

Exemplary Embodiments consistent of the present invention are described based on the assumption that a refresh method of a memory array and a refresh circuit are applied to the DRAM in order to increase the work efficiency of the memory and to reduce the power consumption; however, the application is not limited to the above-mentioned and the present invention can be applied to, for example, a pseudo static random access memory (SRAM) or other scopes.

The present invention is explained hereinafter according to the embodiments used in practice.

Figure 1:
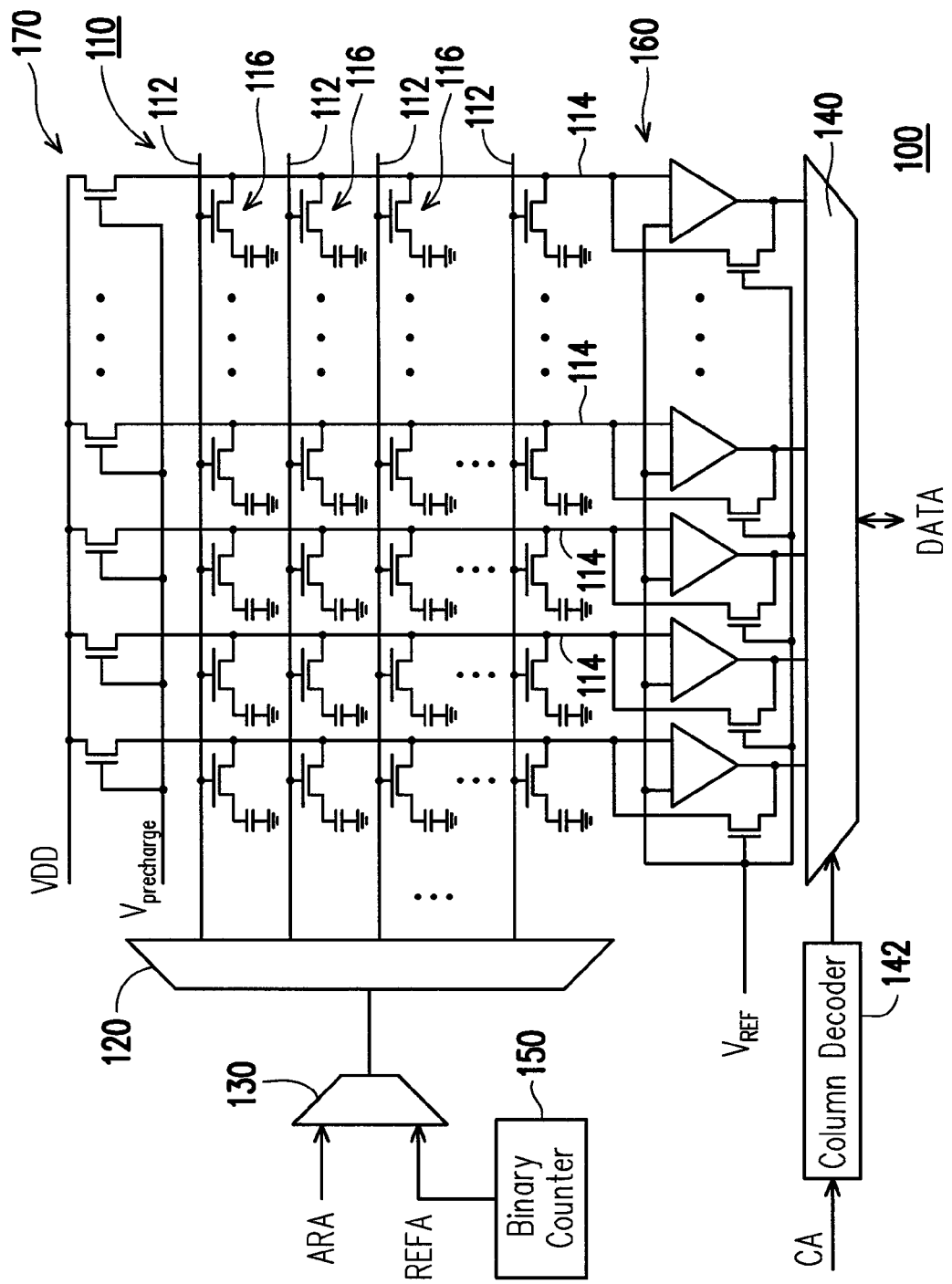
FIG. 1 is a structure diagram illustrating a dynamic random access memory (DRAM).
Figure 2:
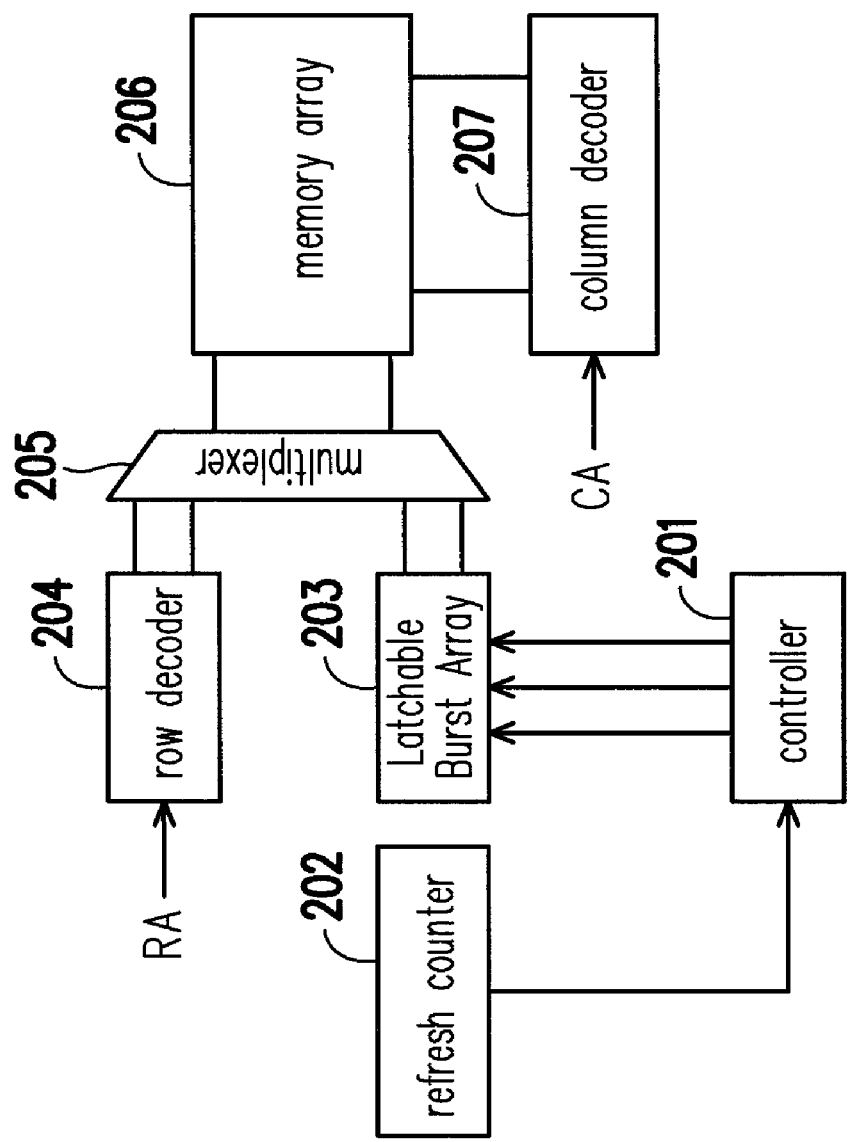
FIG. 2 is a block diagram illustrating a self row-identified hidden refresh circuit.
Figure 3:
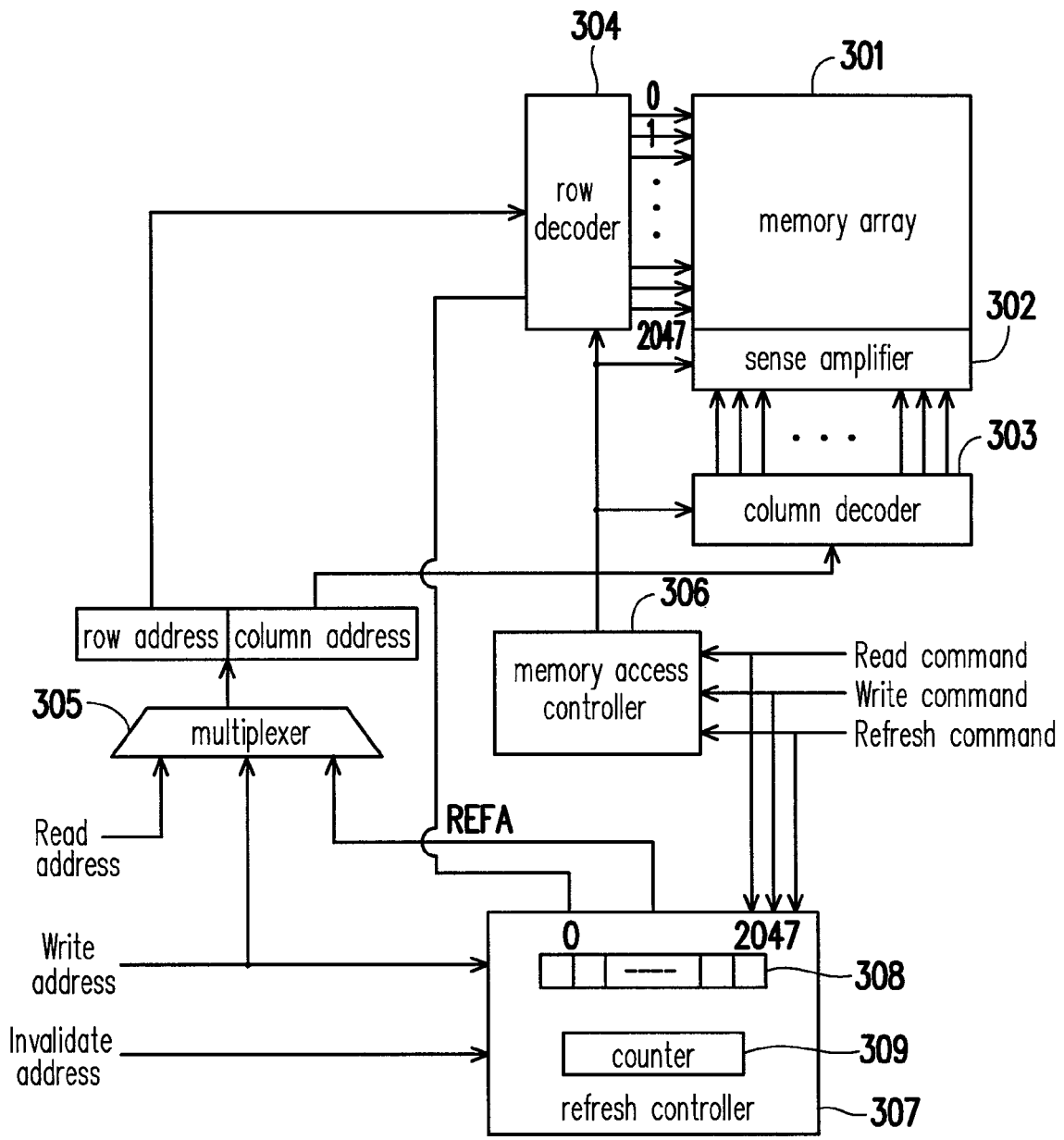
FIG. 3 is a block diagram illustrating a system for selective refresh for a memory array.
Figure 4:
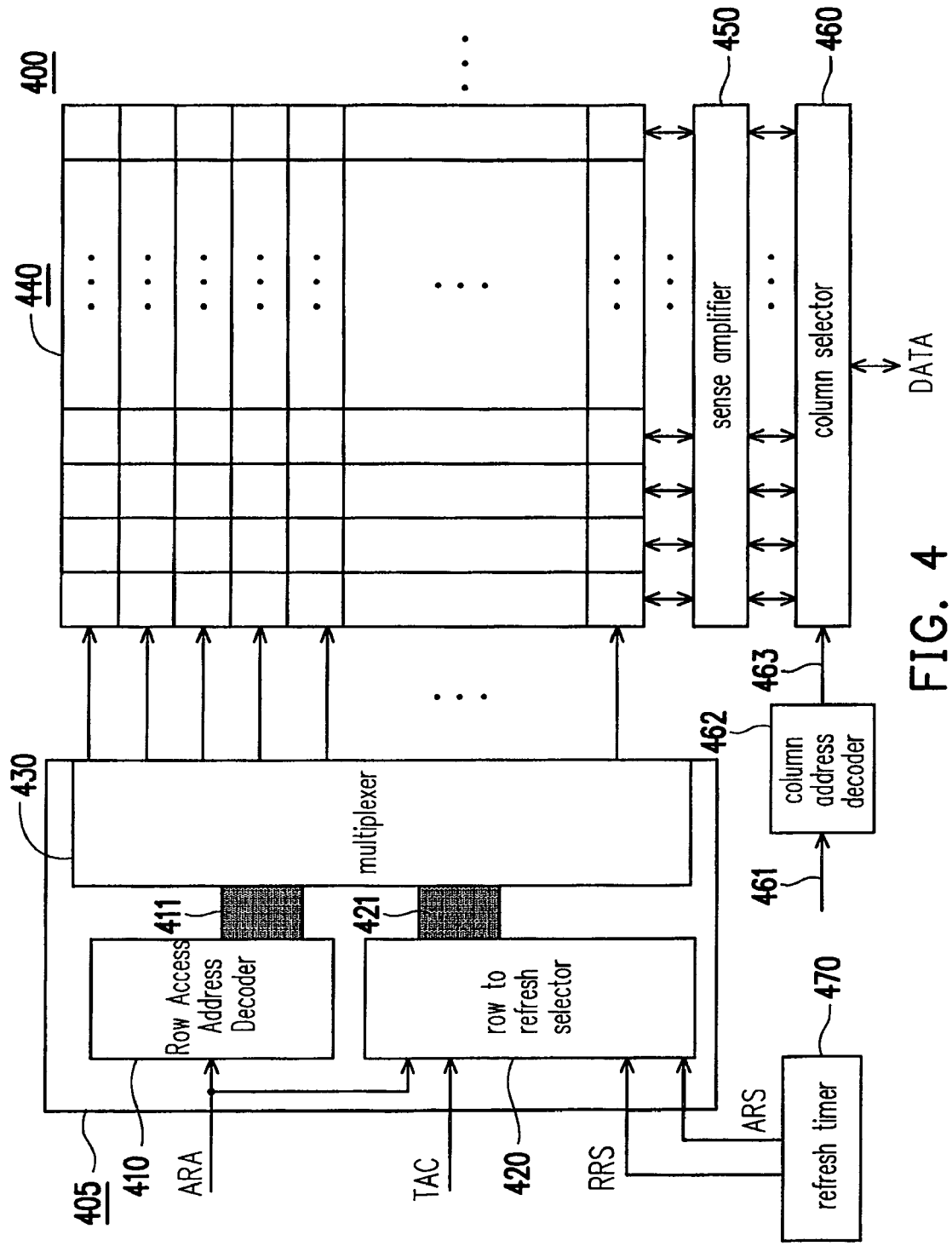
FIG. 4 illustrates a memory device structure diagram according to one embodiment of the present invention.

FIG. 4 illustrates a memory device structure diagram according to an exemplary embodiment consistent of the present invention, where the memory device structure diagram has a memory device with a one level access refresh control mechanism. The memory device 400 includes a row selector 405, a memory array 440, a sense amplifier 450, a column decoder 462, a column selector 460 and a refresh timer 470. The memory array 440 includes a plurality of memory cells arranged in an array. Each of the memory cells is corresponding to a bit line, and the bit lines and the word lines cross each other. The row selector 405 includes a row access address decoder 410, a row to refresh selector 420, and a multiplexer 430.

According to an exemplary embodiment consistent of the present invention, when a system performs an access operation, the row selector 405 receives an access row address (ARA) signal and a tag access control (TAC) signal from the system, so as to access the memory row in the memory array 440 corresponding to the ARA and to configure a tag register. Regarding tag flag registers, each of tag flags is corresponding to one or more than one memory row, and tag flag registers have two setting methods. One of the setting methods is representing which memory rows are valid (or invalid) by using software or hardware of a memory management unit. In other words, the method is representing which memory rows are being used or not being used by the system. The memory rows not being used can be not refreshed because the content thereof is invalid to the system. In addition to the above-mentioned tag access mechanism, the other method is that the tag corresponding to the memory row is automatically configured to represent the content as valid while the system is accessing the memory row of which the corresponding tag is not configured.

In an array refresh period (ARP), each of the valid memory rows in the memory array 440 has to be refreshed or accessed for at least once in order to ensure the content of each of the memory cells can be refreshed within a correct and safe refresh period. A row refresh period (RRP) is the ARP divided by the total number of the memory rows in the memory array 440.

At this moment, the row selector 405 receives an Array Refresh Strobe (ARS) signal generated whenever the ARP starts in order to initiate the ARP. Moreover, row refresh strobe (RRS) signals in a number equal to that of the memory rows in the array are generated and sent to the row selector

405 whenever the ARP starts, in order to perform a refresh operation in the memory array 440.

According to an exemplary embodiment, the ARS signal and the RRS signal can be provided by a refresh timer 470. However, in another embodiment, the ARS signal and the RRS signal can be provided, for example, by an outer circuit according to the actual demands. Herein, the refresh timer 470 can be disposed in the row to refresh selector 420.

According to an exemplary embodiment of the present invention, the row selector 405 can be achieved by using the row address access decoder 410, the row to refresh selector 420 and the multiplexer 430. In the row selector 405, a decode row address 411 is obtained by using the row address access decoder 410 to perform a decode operation. The multiplexer 430 activates the memory row corresponding to the decode row address in the memory array 440, and thereby the memory row can be accessed. In the embodiment of the present invention, the ARA is sent to the row to refresh selector 420 when the system is accessing the memory row, so that the row to refresh selector 420 records the status register corresponding to the ARA. The status register is corresponding to one or more than one memory row. The status register is used to record whether the memory row/memory rows are accessed or refreshed in the ARP.

Therefore, according to the status and the tag flag, it can be known whether the memory row is used by the system and whether the memory row is accessed in the ARP. In the affirmative, the refresh operation can be saved for one time.

According to the embodiment of the present invention, in the structure of the memory device 400, the refresh operation needs to be performed in the ARP. The refresh process is in fact the same as the access operation. As mentioned above, after the memory cell is accessed, a storage unit thereof is charged and no refresh operations are required to be performed in the ARP. According to the exemplary embodiment consistent of the present invention, in the memory device 400, unnecessary refresh operations are diminished by recording whether the memory cell has ever been accessed in the ARP and by finding out one memory row required to be refreshed by means of a specific circuit.

The present invention provides a fresh method of the memory device 400. The refresh method includes determining whether the system is going to perform the access operation whenever each of the ARS signals occurs. If the system is going to perform the access operation and the remained time of the ARP is longer than the time required to refresh the memory rows not refreshed in the memory array 440, then the access operation of the system is performed in priority. After the system completes the access operation, the memory row has been accessed in the memory array requires no refresh operations because a storage unit of the memory cell connected to the corresponding memory row is charged after the memory cell is accessed. At the same time, if the ARA is at one of the memory rows not refreshed in the memory array 440, then the number of the memory rows required to be refreshed is automatically deducted by one, and thereby the work efficiency of the memory device 400 is improved efficiently.

The structure of the above-mentioned refresh method of the memory device is different from the conventional structure using the binary refresh counter. By using the structure, by prioritizing the access operation of the system in the ARP, and by using the mechanism of determining the required time for refreshing the memory rows not refreshed, the work efficiency of the refresh operation can be greatly improved. Also, the problems, such as the pending in the access operation of the system, forced discontinuation of the burst access operation, or etc., caused by refreshing the memory device 400 are diminished.

The structure of the memory device 400 provided by the embodiment of the present invention utilizes a word line selection block to record the access status of the memory row. For example, the tag and the status register in the row to refresh selector 420 are used in the structure. According to the present invention, the structure can skip consecutive memory rows which do not need to be refreshed, and can find out the next memory row required to be refreshed.

According to the embodiment of the present invention, in the structure of the memory device 400, the row to refresh selector 420 includes a plurality of tags and a plurality of statuses, wherein the tags respectively represent whether the memory row is used by the system, and the statuses respectively represent whether the memory row has ever been refreshed or accessed.

Figure 5:
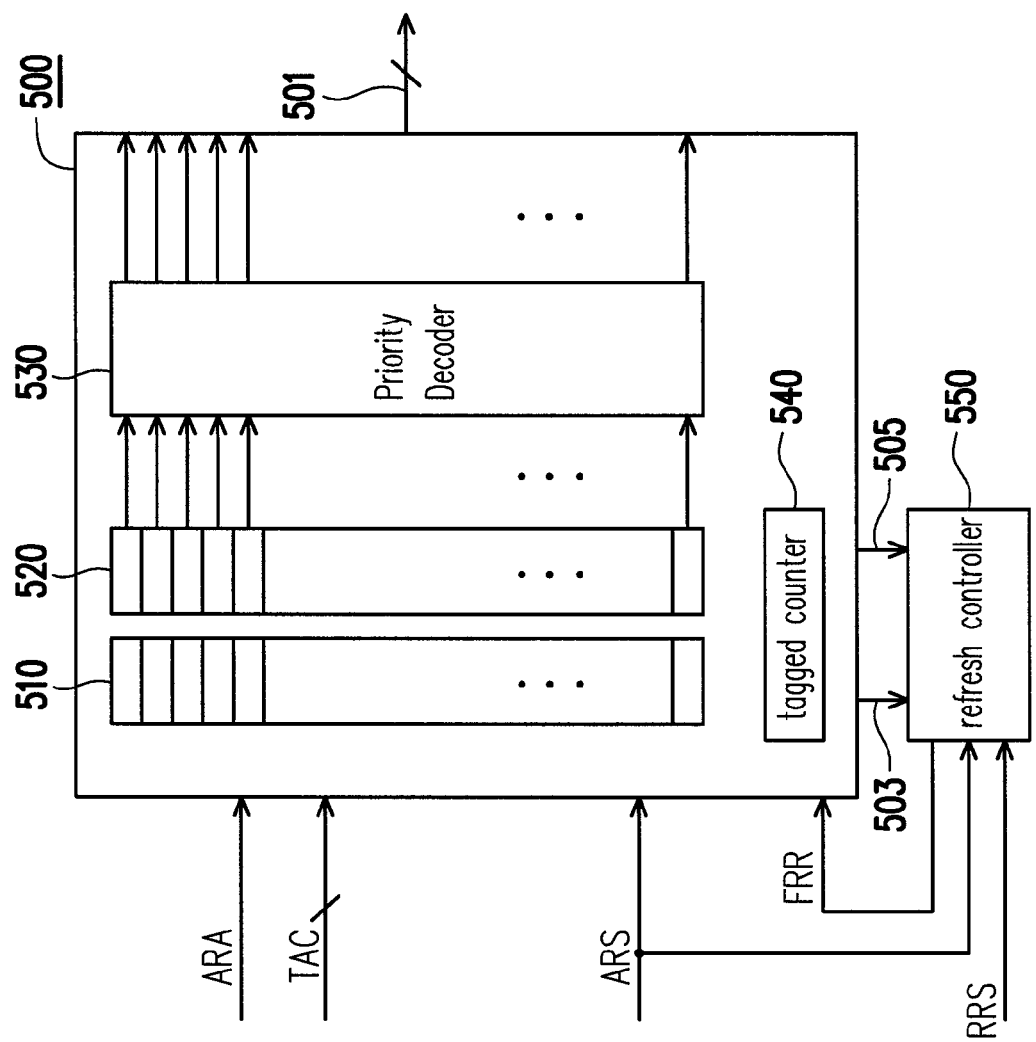
FIG. 5 is a schematic block diagram illustrating a row to refresh selector according to an exemplary embodiment consistent of the present invention.

Please refer to FIG. 5 which illustrates a schematic block diagram in connection with a row to refresh selector 500 according to the embodiment of the present invention. The row to refresh selector 500 can be utilized in the row to refresh selector 420 of FIG. 4, or can be utilized to select the memory cells in one sector to perform the refresh operation. The row to refresh selector 500 utilized in the row to refresh selector 420 of FIG. 4 is illustrated hereinafter as an example; however, the present invention is not limited thereto. The row to refresh selector 500 receives the ARA signal, the TAC signal, the ARS signal, the RRS signal, or etc. The row to refresh selector 500 includes a tag flag register set 510 constituted by a plurality of tag flag registers, a status register set 520 constituted by a plurality of status registers, a priority decoder 530 coupled to the tag flag register set 510 and the status register set 520, and a tagged counter 540 used to calculate a number of the configured tags.

Each of the tag flag registers in the tag flag register set is corresponding to one or a plurality of memory rows, or a group of memory cells. A stored value (bit value) in the tag flag register represents whether the corresponding memory row or a group of memory cells in the memory array is being used or accessed by the system. Each of the status registers in the status register set 520 is corresponding to one or the plurality of memory rows, or the group of memory cells. The stored value (bit value) represents a status regarding whether the corresponding memory row or the group of memory cells needs to be refreshed. Hence, whenever the ARP starts, the ARS signal is received, and all of the status registers in the status register set 520 have to be reconfigured. One memory row in the memory array corresponding to each of the status register is illustrated by using the embodiment described hereinafter as an example.

Whenever the row to refresh selector 500 receives the ARS signal to start the refresh operation, a status reset operation is performed at first. In other words, the content of all of the status registers in the status register set 520 is re-configured as a set status, which represents the corresponding memory row or the group of memory cells in the memory array has not been accessed by the system in the ARP. After that, if the corresponding memory row or a group of memory cells has been accessed, the content is configured as a clear status. The tagged counter 540 is used to calculate a number of the tags stored by the tag flag registers in the tag flag register set 510. In other words, the tagged counter 540 is used to calculate the number of the tag flags configured as the set status in the tag flag register set. In the present embodiment, the tagged counter 540 is used to calculate the number of the memory rows accessed, so as to provide a row to refresh value as described below, and thereby the number of memory rows required to be refreshed can be updated.

Whenever the row to refresh selector 500 receives the ARA signal, requesting the access operation, from the system, it is determined whether the tag flag corresponding to the memory row or a group of memory cells to be accessed is in a clear status. In the affirmative, the corresponding tag flag value is configured as the set status when performing the access operation, and the value of the tagged counter 540 is added by one. In the negative, the system directly accesses the memory row or the group of the memory cells to be accessed.

In the ARP, the RRS signal requests to perform the refresh operation on one of all the memory rows in the memory device. Hence, the structure of the memory device provided by the embodiment of the present invention further includes a refresh controller. The refresh controller can be disposed in the row to refresh selector, or be disposed in any place inside the structure of the memory device without limitation. According to the example, the refresh controller 550 is coupled to the row to refresh selector 500, as shown in FIG. 5. In addition to receiving the ARS signal and the RRS signal, the refresh controller 550 receives a value of the tagged counter 503 and a row to refresh decrease signal 505 from the row to refresh selector 500. In the ARP, according to the RRS signal and the inner mechanism of the refresh controller 550, the refresh controller 550 generates a find a row to refresh (FFR) signal and sends the FFR signal to the row to refresh selector 500. The inner mechanism is described in detail hereinafter.

According to the FFR signal, the row to refresh selector 500 drives the priority decoder 530, so that one memory row which can be refreshed is found by means of a circuit according to the tags and statuses in the tag flag register set 510 and the status register set 520. The circuit is called a priority encoder/decoder outputting an output signal 501 for the row to refresh selector 500.

Figure 6:
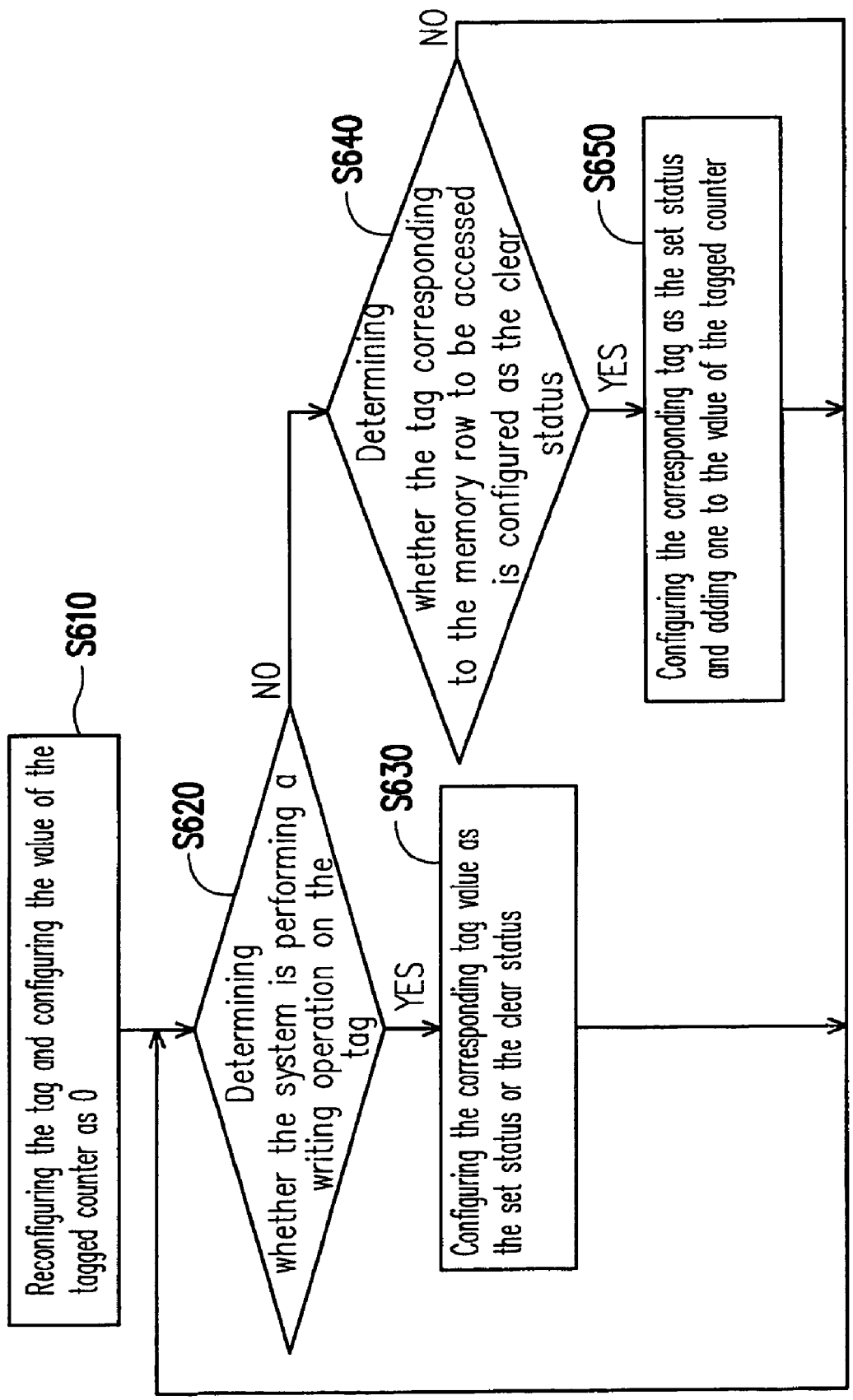
FIG. 6 is a schematic view illustrating the operation method of the tagged counter in the row to refresh selector according to an exemplary embodiment consistent of the present invention.

FIG. 6 is a schematic view illustrating an operation method and configuration in connection with the tag flag register and the tagged row count. The tagged row count is the total number of the configured memory rows corresponding to the tag flag register. The content of the tag flag register is used to represent whether the corresponding memory row is in a valid status, namely, whether the corresponding memory row is required to be refreshed in the ARP. The initial value of the tag is configured as the clear status. Then, in the ARP, some of the tags can be configured by performing the access operation of the system. Alternatively, some of the tags can be configured or can be configured as the set status or the clear status by using the memory management unit or the software of the system. In the above-mentioned, using the memory management unit or the software of the system to configure or to clear means deciding which memories are used or not used (released). The released memories do not need to be refreshed. In the ARP, the tagged row count is the number of the configured tags, obtained from dynamic calculation.

As shown in FIG. 6, the schematic view illustrates the operation method of configuring the tag flag register and the tagged row count. Please refer to a step S610 at first, the content of the tag flag register set 510 is re-configured as the clear status. In other words, the corresponding memory row or the group of the memory cells is configured as a status of being not accessed. At this moment, the value of the tagged counter is configured as the initial value. In the present embodiment, the initial value is 0. Then, a step S620 is entered to determine whether the system is performing a writing operation to alter the status of the tag flag. In the affirmative, in a step S630, the tag value corresponding to the accessed memory row is configured as the set status or the clear status.

In the negative, a step S640 is entered to determine whether the tag corresponding to the memory row to be accessed is configured as the clear status. In the affirmative, in a step S650, the value of the corresponding tag flag is configured as the set status, and the value of the tagged counter is added by one. The steps S640 and S650 are optional items. The operation method of configuring the tagged row count can be completed by merely performing the steps S610 to S630.

Figure 7:
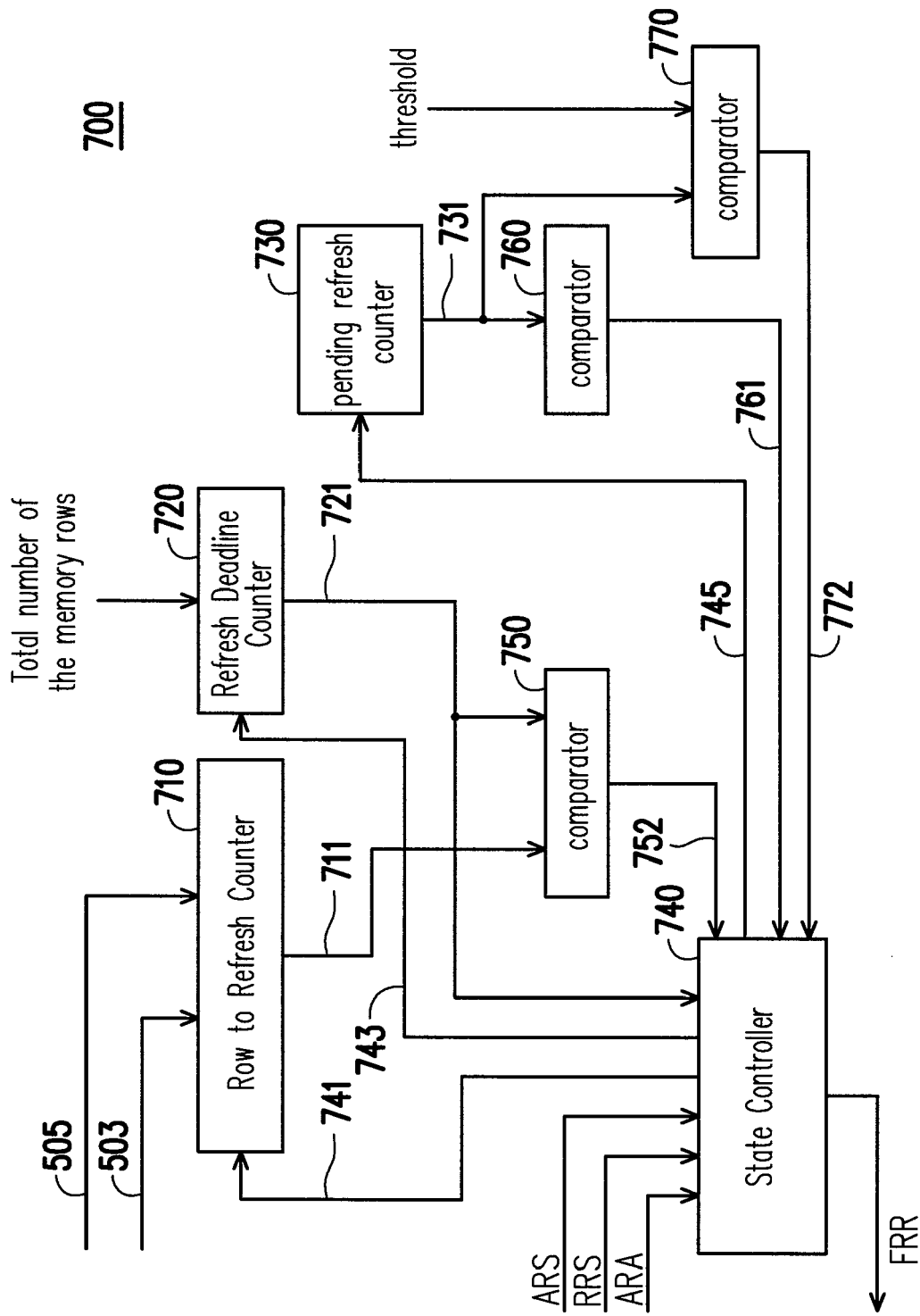
FIG. 7 is a schematic view illustrating a mechanism that a refresh controller finds an FRR signal according to an exemplary embodiment consistent of the present invention.

Please refer to FIG. 7. FIG. 7 is a schematic view illustrating the structure of the memory device having a refresh controller 700 according to the embodiment of the present invention. The refresh controller 700 is used to generate the FFR signal. The refresh controller 700 includes a row to refresh counter 710, a refresh deadline counter 720, a pending refresh counter 730, a state controller 740, comparators 750, 760 and 770.

The refresh controller 770 is coupled to the ARA signal, the ARS signal and the RRS signal. Also, the refresh controller 770 is coupled to the tag flag counter 503 and the row to refresh decrease signal 505 which are transmitted from the row to refresh selector 500 as shown in FIG. 5. The row to refresh counter 710 calculates according to the configured tag value. The value of the row to refresh counter 710 is configured as the initial value when the control signal 741 is received, and the value is gradually decreased when the row to receive decrease signal 505 is received. Thereby, the value of the row to refresh counter 711 is calculated and transmitted to the comparator 750.

The status controller 740 receives the ARA signal, the ARS signal, the RRS signal, the value of the refresh deadline counter, and the output of the three comparators, so as to determine whether to output the FRR signal. The value of the refresh deadline counter is dlcnt 721. The dlcnt 721 represents the number of the rows can be refreshed in the remained time of the ARP. When the ARP starts, the dlcnt 721 is initiated to be the total number of the memory rows, and is transmitted to the comparator 750 and the status controller 740. When the status controller receives an RRS signal, the value of the refresh deadline counter 720 is deducted by one.

The comparator 750 is used to compare the value 711 of the row to refresh counter transmitted from the row to refresh counter 710 with the dlcnt transmitted from the refresh deadline counter 720. When the value 711 of the row to refresh counter 711 is greater than or equal to the dlcnt 721, a low refresh request signal 752 is sent to the status controller 740.

The value 731 of the pending refresh counter is the number of the refresh operations pending in memory rows because the system is performing the access operations. The pending refresh counter 730 stores the value 731 of the pending refresh counter and outputs the value 731 of the pending refresh counter to the comparators 760 and 770. By means of a control signal 745, the status controller 740 can request that the value 731 of the pending refresh counter to be added or deducted by one according to the status of the refresh operation. The comparator 760 is used to determine whether the value 731 of the pending refresh counter is 0. If the value 731 of the pending refresh counter is 0, the comparator 760 outputs a determination result signal 761 to the status controller 740. The determination mechanism includes an optional signal and a data path, and the functions of the determination mechanism can be added according to the actual demands.

Moreover, a high refresh request signal 772 occurs when the value of the pending refresh counter is greater than or equal to the threshold. The comparator 770 is used to compare the value 731 of the pending refresh counter with the threshold. When the value 731 of the pending refresh counter is greater than or equal to the threshold, the high refresh request signal 772 is outputted to the status controller 740.

The status controller 740 receives the ARS signal, the ARA signal, the RRS signal, the dlcnt 721, the low refresh request signal 752, and the high refresh request signal 772. Moreover, the status controller 740 generates and outputs the FRR signal.

Figure 8A:
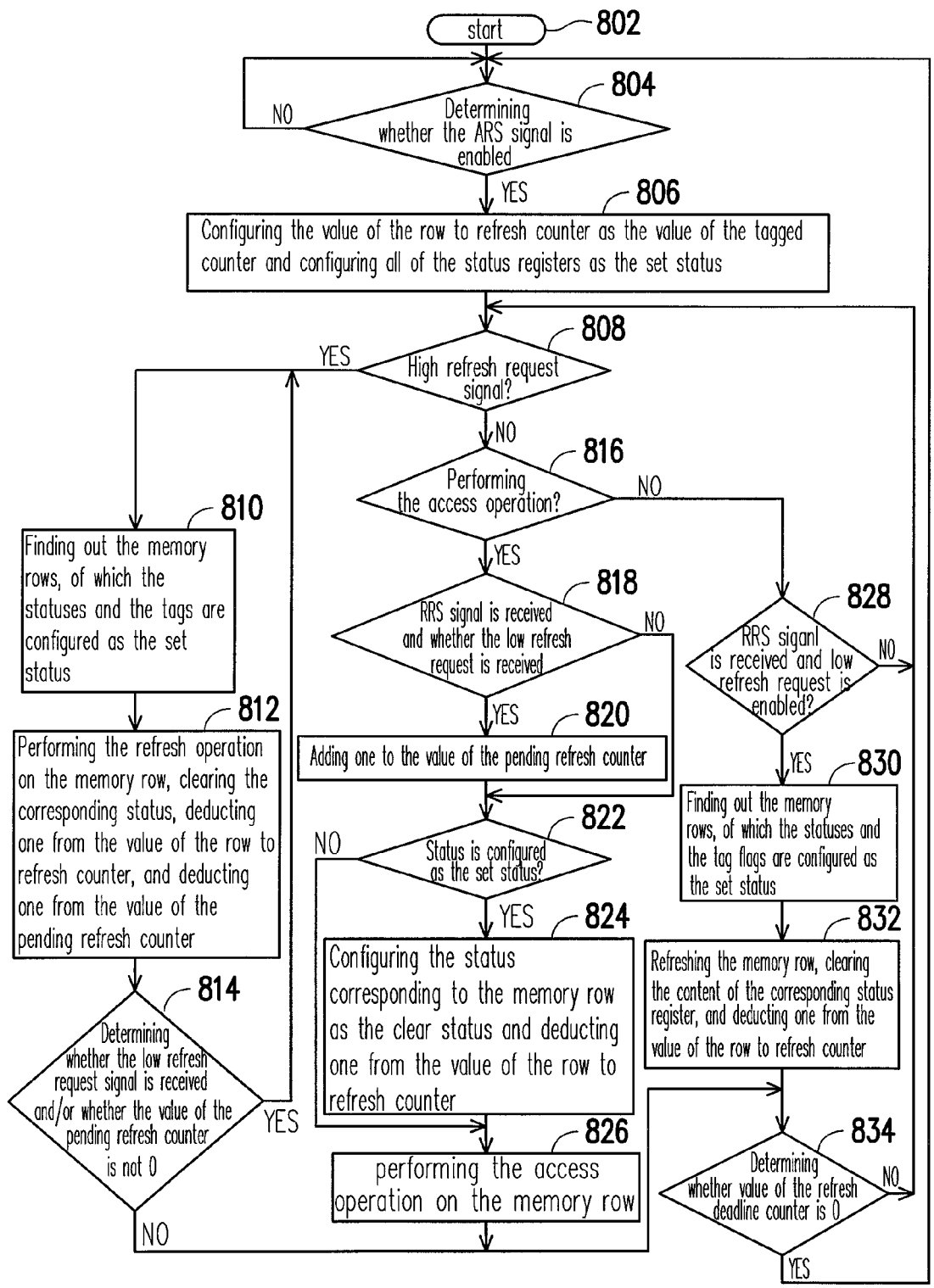
FIGS. 8A and 8B are status control flow charts according to an exemplary embodiment consistent of the present invention.
Figure 8B:
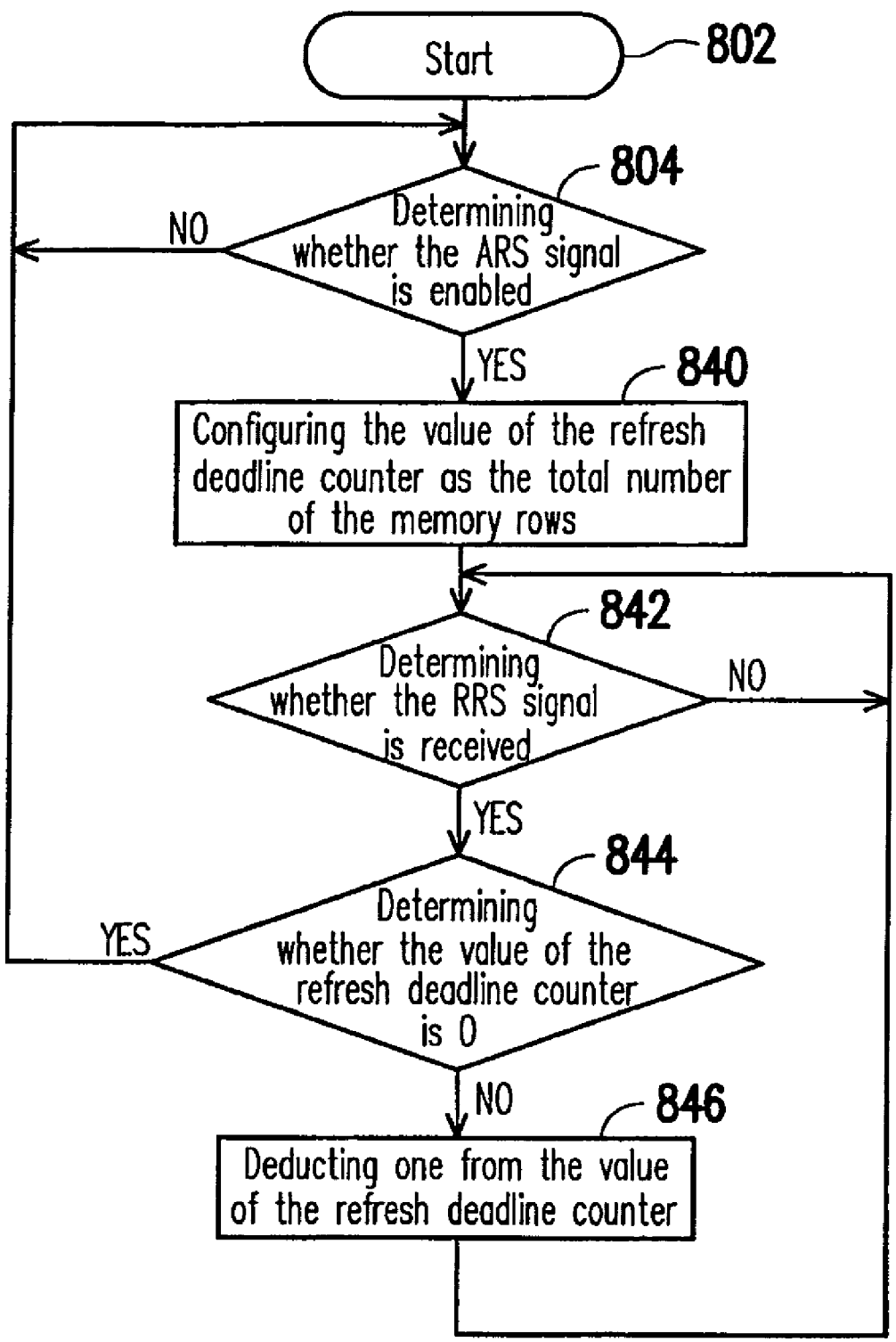

FIGS. 8A and 8B are a schematic view of the status control flow chart illustrating the operation method of the status controller 740 according to one embodiment of the present invention. First, please refer to FIG. 8A. A step 802 is the start of the flow chart. Then, a step 804 is entered to determine whether the ARS signal is enabled. In the negative, the flow chart goes back to the step 802 to continuously repeat the above-mentioned determination from steps 802 to 804 until receiving an instruction of performing the refresh operation. If the instruction of performing the refresh operation is received, the value of the row to refresh counter is configured as the value of the tagged counter, the total number of the memory rows is obtained, the value of the refresh deadline counter is configured as the total number of the memory rows, and all of the status registers are configured as the set status in a step 806.

Next, in a step 808, it is determined whether the high refresh request signal is enabled. In other words, it is determined whether the value of the pending refresh counter is greater than or equal to the threshold. In the affirmative, the refresh process in a step 810 is entered.

In the step 810, the memory rows, of which the statuses and tags are configured as the set status, are found. In other words, the memory rows required to be refreshed are found. After that, in a step 812, the refresh operation is performed on the memory row, the corresponding status is cleared, the value of the row to refresh counter is deducted by one, and the value of the pending refresh counter is deducted by one at the same time. Afterwards, in a step 814, it is determined whether the low refresh request signal is received or whether the value of the pending refresh counter is not 0. If the affirmative, it means that the value of the row to refresh counter is greater than or equal to the value of the refresh deadline counter, and the steps from 810, 812 to 814 are continuously repeated until the disabled low refresh request signal is received and/or the value of the pending refresh counter is not 0.

If the enabled high refresh request signal is not received in the step 808, a step 816 is entered to determine whether the system is going to perform the access operation. In the affirmative, a step 818 is entered to determine whether the RRS signal and the enabled low refresh request are received. In the affirmative, the value of the pending refresh counter is added by one in a step 820, then a step 822 is entered. In the negative, the step 820 is skipped and the step 822 is directly entered to determine whether the status of the memory row or the status of the group of memory cells accessed by the system is configured as the set status. In the affirmative, a step 824 is entered, wherein the status corresponding to the memory row is configured as the clear status and the value of the row to refresh counter is deducted by one. After that, a step 826 is entered to perform the access operation on the memory row. In the negative, the step 824 is skipped and the step 826 is directly entered to perform the access operation on the memory row.

In the step 816, if the system does not request the access operation, then a step 828 is entered to determine whether the RRS signal and the enabled low refresh request signal are received. In the affirmative, a step 830 is entered to find out one of the memory rows of which the statuses and the tag flags are configured as the set status. In other words, one memory row required to be refreshed according to the priority decoder is found out. After that, a step 832 is entered, wherein the memory row is refreshed and the content of the corresponding status register is cleared, so that the value of the row to refresh counter is deducted by one. Then, a step 834 is entered to determine whether value of the refresh deadline counter is 0. In the affirmative, the ARP is ended, and the flow chart returns to the step 804 determining whether the ARS signal is enabled, so that the next ARP starts.

FIG. 9B is a flow chart illustrating how to refresh the value of the refresh deadline counter. A step 802 is the start of the flow chart. Next, a step 804 is entered to determine whether the ARS signal is enabled. In the negative, the flow chart returns to the step 802 and continuously repeats the steps 802 to 804 until the enabled ARS signal is received. After the enabled ARS signal is received, a step 840 is entered, wherein the value of the refresh deadline counter is configured as the total number of the memory rows. Then, a step 842 is entered to determine whether the RRS signal is received. In the negative, the step 842 is continuously repeated. In the affirmative, the step 844 is then entered to determine whether the value of the refresh deadline counter is 0. In the affirmative, it means the ARP is ended, and the flow chart returns to the step 804. However, if the value of the refresh deadline counter is not 0, the value of the refresh deadline counter is deducted by one in a step 846. Then, the flow chart returns to the step 842 to determine whether the RRS signal is received.

Figure 9:
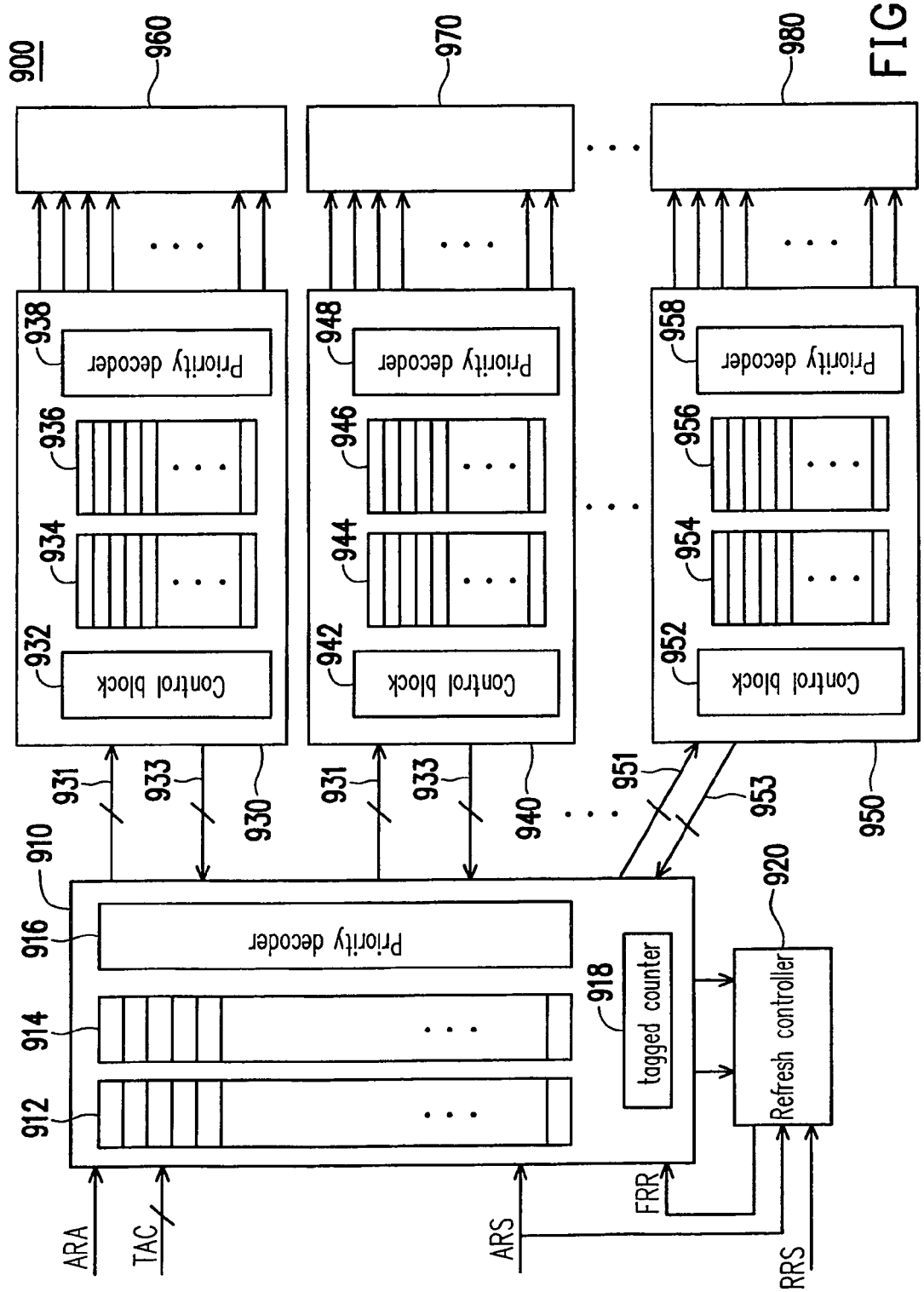
FIG. 9 illustrates a structure diagram of the memory device according to another embodiment of the present invention.

Please refer to FIG. 9 which illustrates the structure diagram of the memory device according to another embodiment of the present invention. In the structure of the memory device, a memory device 900 having a two level access refresh control mechanism is provided. The refresh control mechanism includes a first level access control circuit and a plurality of second level access control circuits. The following descriptions are provided to illustrate the refresh control mechanism constituted by the first level access control circuit 910, and the second access control circuits 930, 940 and 950 coupled to the first level access control circuit 910 as an example. However, the present invention is not limited to the example. The first level access control circuit 910 mainly controls the access operations and the refresh operations to all of the memory rows in the structure of the memory device. The second level access control circuit performs the access operations and the refresh operations respectively on every memory row corresponding to a sector. The memory device having the two level access refresh control mechanism can reduce a logic delay time, so as to increase a clock frequency of the system, and to extend the control to a plurality of sector memory devices. Therefore, the refresh operation to the mega-size memory can be managed effectively.

The multilevel structure mainly utilizes the row to refresh selector as shown in FIG. 5 to construct the multilevel control mechanism. The tag flag register set and the status register set in the first level access control circuit is respectively corresponding to the tag values and the statuses of a plurality of sectors in the memory array in order to confirm whether all of the sectors are cleared. The second level access control circuit is corresponding to the sector in the memory array; however, the operation method of the second level access control circuit is the same as that in FIG. 5.

The first level access control circuit 910 receives the ARA signal, the TAC signal, the ARS signal, the RRS signal and the FFR signal from a refresh controller 920. The first level access control circuit 910 includes a tag flag register set 912 constituted by a plurality of tag flag registers, a status register 914 constituted by a plurality of status registers, a priority decoder 916, and a tagged counter 918 used to calculate the number of the tags whose status is changed.

The second level access control circuits are illustrated by referring to FIG. 9 as an example. As shown, the second level access control circuits 930, 940 and 950 respectively include control blocks 932, 942 and 952; tag flag register sets 934, 944 and 954; status register sets 936, 946 and 956; and priority decoders 938, 948 and 958. The second level access control circuits 930, 940 and 950 are respectively corresponding to the sectors 960, 970 and 980 in the memory array.

The first level access control circuit 910 transmits the TAC signal and the ARS signal to the second level access control circuits 930, 940 and 950 respectively through multi-bit circuits 931, 941 and 951. The second level access control circuit 930, 940 and 950 send back, for example, the tag value and the status to the first level access control circuit 910 respectively through multi-bit circuits 933, 943 and 953.

The access refresh control mechanism of the first level access control circuit 910 is similar to that of the FIGS. 5 and 6. The difference lies in that the value stored in every tag flag of the tag flag register set 912 and in every status of the status register set 914 represents whether all of the second level access control circuits 930, 940 and 950 are useful, accessed, or refreshed in the ARP.

For example, the tag T1 of the tag flag register set 912 and the status S1 of the status register set 914 are corresponding to the second level access control circuit 930. The second level access control circuit 930 records the tags and the statuses corresponding to the memory rows $0 \sim 2^{10}-1$. The tag T2 and the status S2 are corresponding to the second level access control circuit 940. The second level access control circuit 940 records the tags and the statuses corresponding to the memory rows $2^{10} \sim 2^{20}-1$. When the statuses in the second row to refresh selector (e.g. 411a) are configured as the clear status, then the status S1 of the first row to refresh selector is configured as the clear status. In other words, the refresh operations of the memory rows $0 \sim 2^{10}-1$ are completed. Thereby, the refresh operations of the memories can be managed effectively, the logic delay time is decreased, and the clock frequency of the system can be increased.

Figure 10:
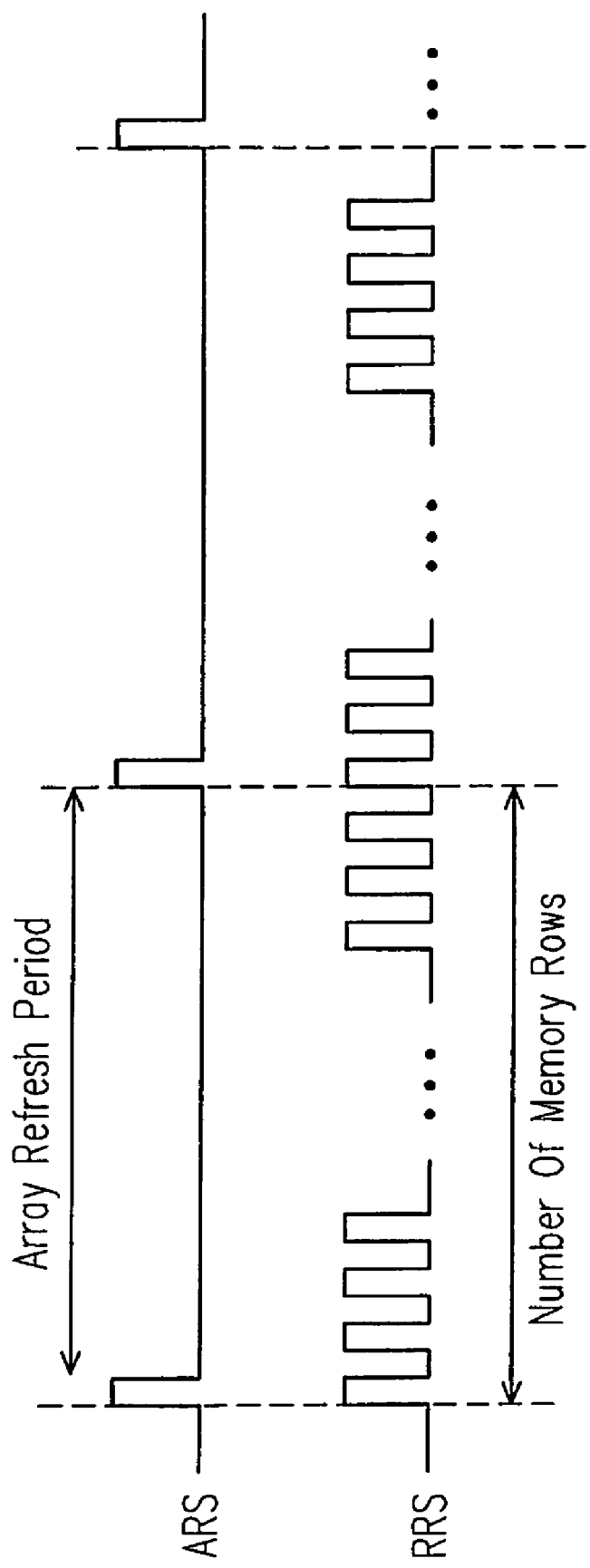
FIG. 10 is a signal timing diagram illustrating an ARS signal and an RRS signal provided by the refresh timer.

FIG. 10 is a timing diagram illustrating the ARS signal and the RRS signal provided by the refresh timer. After the ARS signal is enabled, the ARP starts. The refresh timer provides a series of the RRS signals. A pulse number of the RRS signal depends on the total number of the memory rows in the memory device.

Figure 11:
FIG. 11 is a timing diagram of a refresh circuit of the memory array according to an exemplary embodiment consistent of the present invention.

FIG. 11 is a timing diagram illustrating the refresh circuit of the memory array according to one embodiment consistent of the present embodiment. When the ARS signal is enabled, then the ARP starts and the series of the RRS signals is provided. The memory row 512 is illustrated herein as an example. When the refresh operation starts, the value of the refresh deadline counter is configured as 512, and the value of the row to refresh counter is configured as 412. In other words, the total number of the memory rows of which the corresponding statuses required to be refreshed is 412. The access operation of the system is prioritized, when the system is not performing the access operation, as indicated by the reference numeral 1101, because the value of the refresh deadline counter is greater than the value of the row to refresh counter after several RRS signals occurred.

As mentioned above, according to the embodiment of the present invention, the fresh method of the memory device includes determining whether the system is going to perform the access operation in every ARP. If the system is going to perform the access operation and the remained time of the ARP is longer than the time required to refresh the memory rows not refreshed in the memory array, then the access operation of the system is performed in priority. After the system completes the access operation, the memory row has been accessed in the memory array does not need to be refreshed because the storage unit of the memory cell connected to the corresponding memory row is charged after the memory cell is accessed. At the same time, if the ARA is at one of the memory rows not refreshed, then the number of the memory rows required to be refreshed is automatically deducted by one, and thereby the work efficiency of the memory device 400 is improved efficiently.

Therefore, as indicated by the reference numeral 1102, although the value of the refresh deadline counter is configured as 510, the value of the row to refresh counter is significantly reduced to 324. After the accessing is performed by the system marked with reference numeral 1104, the value of the refresh deadline counter is configured as 310, and the value of the row to refresh counter is also 310. Therefore, the status controller enables the FFR signal and performs necessary refresh operations according to the signal received by the status controller.

FIG. 12 illustrates a truth table embedded in a priority decoder according to an exemplary embodiment consistent of the present invention. As shown, in the input signals received by an input end, a portion of the input signals is bit data and a portion of the input signals needs no consideration (herein, x means no consideration, i.e., "don't care"). According to an input, an output value can be obtained. According to the only value "1" in the bit data, an object to be refreshed is chosen.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A memory device, comprising:
   a status register set comprising a plurality of status registers, wherein each of the status registers is corresponding to one or a plurality of memory rows for recording refresh statuses and access statuses of the memory rows in an array refresh period (ARP);
   a refresh timer for generating an array refresh strobe (ARS) signal and a row refresh strobe (RRS) signal, so that a refresh device initiates the array refresh period (AP) and a row refresh period (RRP);
   a row to refresh counter recording a number of the memory rows required to be refreshed;
   a refresh deadline counter calculating the number of the memory rows which can be refreshed in a remained time of the array refresh period (ARP); and
   a row selector used to find out one memory row or a group of memory cells which can be refreshed according to contents stored in the status registers.

2. The memory device according to claim 1, wherein when the array refresh period (ARP) starts, the status registers are configured as a set status; and
   when the memory row corresponding to the status register is accessed or refreshed, a corresponding status of the corresponding status register is configured as a clear status, wherein the status register is used to represent whether the memory row corresponding thereto needs to be refreshed in the array refresh period (ARP).

3. The memory device according to claim 2, wherein when the array refresh period (ARP) starts, the value of the row to refresh counter is configured as a total number of the memory rows; and when any of the status register is configured as the clear status, a value of the row to refresh counter is deducted by one, wherein the value of the row to refresh counter is deducted by one when any of the memory row not accessed and not refreshed is accessed or refreshed.

4. The memory device according to claim 3, wherein when the array refresh period (ARP) starts, a value of the refresh deadline counter is initiated to be the total number of the memory rows; and the value of the refresh deadline counter is deducted by one after receiving the row refresh strobe (RRS) signal.

5. The memory device according to claim 1, wherein when the row refresh strobe (RRS) signal occurs, if the value of the row to refresh counter is greater than or equal to the value of the refresh deadline counter, the row selector finds out one memory row with the set status to perform a refresh operation according to the status register set.

6. The memory device according to claim 1, wherein the row selector is a priority decoder.

7. The memory device according to claim 1, wherein the status register set and the row selector are a multilevel structure comprising the status registers and the row selector arranged in a multilayer manner.

8. The memory device according to claim 7, wherein the row selector is a priority decoder.

9. The memory device according to claim 1, further comprising a pending refresh counter used for recording a number of refresh operations which are required but pending to be performed on the memory rows when an access operation is performing on the memory device.

10. The memory device according to claim 9, wherein the pending is according to a preset tolerable value (threshold); when the row refresh strobe (RRS) signal occurs, if a value of the pending refresh counter is greater than or equal to the preset tolerable value (threshold), the row selector finds out one memory row with a set status to perform the refresh operation according to the status register set.

11. The memory device according to claim 10, wherein when the row refresh strobe (RRS) signal occurs, if the value of the pending refresh counter is greater than or equal to the preset tolerable value (threshold), the row selector finds out one memory row with the set status to perform the refresh operation, according to the status register set, and one is deducted from the value of the pending refreshing counter until the value of the pending refresh counter is 0.

12. A memory device, comprising:
a status register set including a plurality of status registers, wherein each of the status registers is corresponding to one or a plurality of memory rows for recording refresh statuses and access statuses of the memory rows within a refresh period;
a tag flag register, for storing a plurality of tags, wherein each of the tags is corresponding to one or more of the memory rows;
a tagged counter, for calculating a number of the tags configured as a set status, and the number of the tags configured as the set status is automatically added or deducted when the system increases or decreases the tags with the set status;
a refresh timer, for generating an array refresh strobe (ARS) signal and an row refresh strobe (RRS) signal, so that the memory device can initiate an array refresh period (ARP) and an row refresh period (RRP);
a row to refresh counter, for recording a number of the memory rows required to be refreshed; and
a refresh deadline counter, for calculating the number of the memory rows which can be refreshed in a remained time of the array refresh period (ARP).

13. The memory device according to claim 12, wherein when the array refresh period (ARP) starts, the status registers are configured as the set status, and when the memory row corresponding to the status register is accessed or refreshed, the set status is configured as a clear status, wherein the status register is used to represent whether the memory row corresponding thereto needs to be refreshed in the array refresh period (ARP).

14. The memory device according to claim 12, wherein a setting method of the tag flag register includes using a memory management unit to mark the memory rows as valid or invalid; in other words, the memory rows are being used or not being used, and if the memory rows contain content invalid, the memory rows do not need to be refreshed.

15. The memory device according to claim 12, wherein the setting method of the tag flag register includes automatically marking content of the memory row or the memory rows as valid when the memory row or the memory rows are accessed and the tags of the memory row or the memory rows are not configured, and includes configuring all of the tags as the clear status when the system starts to operate; in other words, tags are used as access control and the tags corresponding to the memory rows are configured as the set status or the clear status, so as to represent the memory rows corresponding to the tags as valid or invalid.

16. The memory device according to claim 12, wherein when the array refresh period (ARP) starts, the value of the row to refresh counter is configured as the value of the tagged counter; the value of the row to refresh counter is deducted by one after any of the status registers is configured as the clear status, wherein the value of the row to refresh counter is deducted by one when any of the memory row not accessed and not refreshed is accessed or refreshed.

17. The memory device according to claim 12, wherein when the array refresh period (ARP) starts, a value of the refresh deadline counter is initiated to be a total number of the memory rows; the value of the refresh deadline counter is deducted by one after receiving an row refresh strobe (RRS) signal.

18. The memory device according to claim 12, further comprising a row decoder used for finding out one of the memory rows or a group of memory cells which can be refreshed, wherein when the row refresh strobe (RRS) signal occurs, the row decoder finds out one memory row which is in the set status to perform a refresh operation according to the status register set if the value of the row to refresh counter is greater than or equal to the value of the refresh deadline counter.

19. The memory device according to claim 12, wherein the row selector is a priority decoder.

20. The memory device according to claim 12, wherein the status register set, the tag flag register set and the row selector are a multilevel structure comprising the status registers, the tag flag register set and the row selector arranged in a multilevel manner.

21. The memory device according to claim 12, further comprising a pending refresh counter used for recording a number of refresh operations which are required but pending to be performed because an access operation is performing on the memory device, wherein the pending of the number of the refresh operations is according to a preset threshold, when the row refresh strobe (RRS) signal occurs, if a value of the pending refresh counter is greater than or equal to the preset threshold, the row selector finds out one memory row which is in the set status to perform the refresh operation according to the status register set.

22. The memory device according to claim 21, wherein the row refresh strobe (RRS) signal occurs, if the value of the pending refresh counter is greater than or equal to the preset threshold, the row selector finds out one of the memory rows which is in the set status to be refreshed, according to the status register set, until the value of the pending refresh counter is 0.

23. A refresh method of a memory device, wherein the memory device comprises a memory array, wherein the memory array comprises a plurality of memory rows, the refresh method comprises:
   using a status value to record whether the memory row corresponding to the status value is refreshed or accessed in an array refresh period (ARP);
   determining that the memory rows are not refreshed when a remained time of the array refresh period (ARP) is longer than a time required to refresh the memory rows which are not refreshed; and
   selecting one of the memory rows which is not refreshed and not accessed to perform a refresh operation if the remained time is less than or equal to the time required to refresh the memory rows.

24. The refresh method of the memory device according to claim 23, if a number of the memory rows pending to be refreshed is greater than or equal to a threshold, then the row selector finds out one of the memory rows which are not refreshed and not accessed to perform the refresh operation according to the status value.

25. A refresh method of a memory device, wherein the memory device comprises a memory array comprising a plurality of memory rows, the refresh method comprising:
   using a tag value to represent whether the ding memory row corresponding to the tag value is being used, and using a status value to record whether the memory row corresponding to the status value is refreshed or accessed in an array refresh period (ARP);
   determining that the memory rows do not need to be refreshed when a remained time of the array refresh period (ARP) is longer than a time required to refresh the memory rows which are not refreshed; and selecting the memory row which is not refreshed, is not accessed, and is represented by the tag value as being used if the remained time is less than or equal to the time required to refresh the memory rows.

26. The refresh method of the memory device according to claim 25, if a number of the memory rows pending to be refreshed is greater than or equal to a threshold, then the row selector finds out one memory row which is not refreshed, not accessed, and represented by the tag value as being in use according to the status value and the tag value in order to perform a refresh operation.

* * * * *